(12) United States Patent
Sweeney et al.

(10) Patent No.: US 6,949,992 B2
(45) Date of Patent: Sep. 27, 2005

(54) SYSTEM AND METHOD OF PROVIDING HIGHLY ISOLATED RADIO FREQUENCY INTERCONNECTIONS

(75) Inventors: Richard Sweeney, Rancho Santa Margarita, CA (US); Jason Snodgress, Cameron Park, CA (US)

(73) Assignee: Powerwave Technologies, Inc., Santa Ana, CA (US)

( * ) Notice: Subject to any disclaimer, the term of this patent is extended or adjusted under 35 U.S.C. 154(b) by 69 days.

(21) Appl. No.: 10/103,277

(22) Filed: Mar. 20, 2002

(65) Prior Publication Data

US 2003/0179055 A1 Sep. 25, 2003

(51) Int. Cl.$^7$ ............................... H01P 3/08; H01P 1/00
(52) U.S. Cl. ....................................... 333/246; 333/260
(58) Field of Search .................... 333/246, 260, 333/254

(56) References Cited

U.S. PATENT DOCUMENTS

| | | | |
|---|---|---|---|
| 4,019,141 A | | 4/1977 | Numan |
| 4,041,399 A | | 8/1977 | Tsuda |
| 4,352,209 A | | 9/1982 | Ma |
| 4,370,515 A | | 1/1983 | Donaldson |
| 4,370,700 A | | 1/1983 | Duddles et al. |
| 4,404,617 A | | 9/1983 | Ohyama et al. |
| 4,494,095 A | | 1/1985 | Noji et al. |
| 4,661,998 A | | 4/1987 | Yamashita et al. |
| 4,695,810 A | * | 9/1987 | Heckaman et al. ............. 333/1 |
| 4,739,453 A | | 4/1988 | Kurokawa |
| 4,754,101 A | | 6/1988 | Stickney et al. |
| 4,800,464 A | | 1/1989 | Roos et al. |
| 4,831,498 A | | 5/1989 | Baba |
| 4,862,120 A | * | 8/1989 | Ruxton et al. ................. 333/34 |
| 5,014,160 A | | 5/1991 | McCoy, Jr. |
| 5,021,755 A | * | 6/1991 | Gustafson ................... 333/128 |
| 5,065,123 A | * | 11/1991 | Heckaman et al. ......... 333/246 |
| 5,107,404 A | | 4/1992 | Tam |
| 5,160,807 A | | 11/1992 | Fry et al. |
| 5,252,782 A | | 10/1993 | Cantrell et al. |
| 5,323,299 A | | 6/1994 | Weber |
| 5,353,201 A | | 10/1994 | Maeda |
| 5,475,876 A | | 12/1995 | Teradda et al. |

(Continued)

FOREIGN PATENT DOCUMENTS

| EP | 0 407 072 A1 | 9/1991 |
|---|---|---|
| EP | 1 089 336 A2 | 4/2001 |

OTHER PUBLICATIONS

Harper, Charles A., "Substrates for RF and Microwave Systems", High Performance Printed Circuit Boards, 2000, pp. I, 3.39–3.45, McGraw–Hill, New York, NY.

Hollomon, Jr., James K., "Key Differences Between SMT and IMC Assembly", Surface–Mount Technology for PC Board Design, 1995, pp. i, xvii, 86–90, Howard W. Sams & Company, Indianapolis, IN.

*Primary Examiner*—Patricia Nguyen
(74) *Attorney, Agent, or Firm*—Paul B. Heynssens; Peter J. Meza; Hogan & Hartson LLP (57) ABSTRACT

A surface mount technology ("SMT") apparatus for use in routing radio frequencies ("RF") between cavities that require a high level of isolation on a single printed circuit board ("PCB"). The SMT part is attached to the PCB over a stripline-ready trace which transitions to microstrip before and after the SMT stripline part to maintain consistent characteristic impedance. When presented with a high isolation need between two cavities using microstrip transmission lines, the proposed stripline SMT apparatus under the isolation wall will tend to provide the necessary isolation. The present invention provides a repeatable and reliable interconnect while improving the electrical match between the two cavities. Furthermore, the invention removes the costs associated with manually forming and soldering cables between PCBs.

27 Claims, 5 Drawing Sheets

U.S. PATENT DOCUMENTS

| | | | | |
|---|---|---|---|---|
| 5,614,442 A | * | 3/1997 | Tserng | 438/122 |
| 5,808,529 A | * | 9/1998 | Hamre | 333/246 |
| 5,889,320 A | * | 3/1999 | Phelps et al. | 257/698 |
| 6,093,888 A | | 7/2000 | Laureanti et al. | |
| 6,160,571 A | | 12/2000 | Wang | |
| 6,269,008 B1 | | 7/2001 | Hsu | |
| 6,803,664 B2 | * | 10/2004 | Murayama | 257/779 |

* cited by examiner

SYSTEM AND METHOD OF PROVIDING HIGHLY ISOLATED RADIO FREQUENCY INTERCONNECTIONS

BACKGROUND OF THE INVENTION

The present invention relates generally to radio frequency ("RF") and electromagnetic interference ("EMI") protection for electronic circuitry, and in particular, to a surface mount technology ("SMT") stripline structure used in combination with an isolation wall for routing radio frequencies between two cavities that require a high level of isolation.

Printed circuit boards ("PCB") comprise a dielectric substrate which supports the printed wiring, including both circuit and ground traces. The detailed method of construction of printed circuit board and the materials used are well known in the art. Many PCBs require a means of signal isolation to reduce or prevent RFI and EMI between various groups or blocks of circuitry. The circuit blocks comprise both active and passive components. In accordance with conventional SMT practice, these electrical components are mounted on the top surface of the printed circuit board during the automated ("component population") phase of the manufacturing process. As used here, the terms EMI and RFI denote RF signals unintentionally coupled, radiated, or otherwise transmitted between circuit blocks that are intended to be mutually isolated. Ideally, circuit blocks that are likely to create, or to be susceptible to, EMI in or from other nearby circuitry would be contained within a single shielded enclosure or cavity.

When a shielded transmission line is used to connect or route RF signals between physically separated shielded cavities, the shielded transmission line minimizes EMI by providing a continuous extension of the shielding surfaces of the separated cavities. The internal structure of the transmission line is selected so that its characteristic impedance within the frequency bands of interest is both well defined and controlled in order to minimize RF signal distortion and maximize the transfer of desired RF signal power. Conventional examples of shielded transmission line include stripline and coaxial cable.

The term stripline commonly denotes a structure comprising a signal conducting strip and two ground planes which extend considerably in transverse directions. The space between the ground planes is filled with a dielectric medium and the central strip is embedded in this dielectric. The ground planes are at zero RF potential relative to each other. Coaxial cable utilized as an isolated interconnecting transmission line is not compatible with the automated SMT assembly process flow and generally must be hand formed and soldered at a much greater expense.

An example of an unshielded transmission line is microstrip, comprising a single dielectric substrate with ground plane on one side and a signal conducting strip on the other face. Unlike stripline, SMT components can be attached directly to the signal conducting top layer of microstrip. Microstrip is also subject to EMI from nearby conductors because of its unshielded structure.

When coaxial cable is not used, the conventional structure of SMT assemblies requiring a shielded transmission line interconnection is a multilayer PCB incorporating at least one stripline structure as described above (ground layer, dielectric, signal conducting strip, dielectric, ground layer) and optional layers for routing other signals. The performance constraints imposed by this solution include:

1) The multilayer PCB structure exhibits increased thermal resistance from the SMT component side to the reverse side which is commonly attached to a heatsink.

2) In practice, the two ground planes are conventionally connected together along two paths parallel to the entire length of the central conducting strip, in order to minimize the difference of potential between the ground planes, and thereby minimize coupling of RF signals between the stripline structure and adjacent circuitry. The ground plane interconnection is normally accomplished with conductive through-holes, thereby adding significant cost to the final PCB assembly.

3) PCB material handling and processing costs are much lower when the unpopulated PCB consists of only a back conductive layer, one dielectric layer, and a top SMT compatible layer. Converting the entire PCB to a multilayer PCB structure when only a small number of shielded interconnections are required adds unnecessarily to the final assembly weight, size and cost.

4) Specialized circuit functions including RF power amplifiers are conventionally fabricated on PCB materials, including hard or brittle ceramic substrates, that are not compatible with multilayer PCB fabrication techniques, thereby precluding the inclusion of stripline as an inherent part of the unpopulated PCB.

Those having skill in the art would understand the desirability of having a radio frequency interconnection that has high isolation, without and does not need extensive hand assembly to produce. This type of radio frequency interconnection would necessarily provide sufficient isolation, and allow surface mount technology to be utilized, thus allowing the cost efficient manufacturing of high frequency circuit assemblies to be achieved.

SUMMARY OF THE INVENTION

In accordance with one aspect of the invention, there is provided a SMT stripline structure for routing RF between cavities that require a high level of isolation. The structure comprises a PCB with the printed ground and circuit trace and an SMT stripline part which is attached to the base PCB during the normal component population. The SMT stripline part comprises an upper and lower ground plane pattern, with a layer of dielectric in between. The SMT stripline part is installed on the PCB stripline-ready trace using conventional SMT component attachment means. The PCB stripline-ready trace transitions to microstrip before and after the SMT stripline structure to maintain consistent characteristic impedance.

The proposed invention allows for a more repeatable and reliable interconnect while improving the electrical match between the two cavities. Additionally, the invention removes the costs associated with manually forming and soldering cables between PCBs.

DETAILED DESCRIPTION

These and other features and advantages of the present invention will be better understood from the following detailed description read in light of the accompanying drawings, wherein.

Like reference numerals are used to designate like parts in the accompanying drawings.

DETAILED DESCRIPTION OF THE DRAWINGS

The present invention relates generally to RF and electromagnetic interference protection for electronic circuitry, and in particular, to a SMT stripline structure for routing of RF between two areas that need a high level of isolation.

Figure 1:
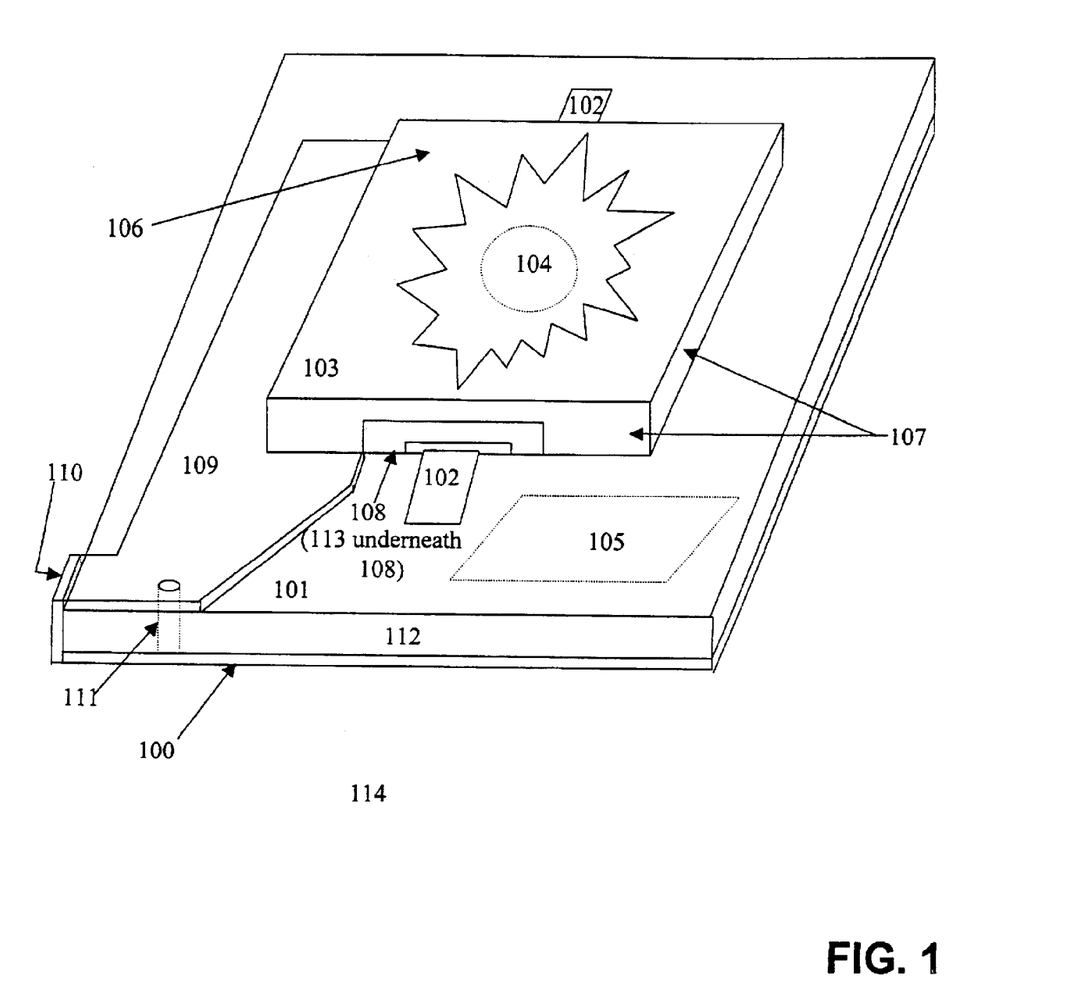
FIG. 1 is a view a printed wiring assembly having one or more highly isolated RF interconnections.

FIG. 1 is a view a printed wiring assembly 114 having one or more highly isolated REF interconnections. In the embodiment shown the printed wiring assembly ("PWB assembly") 101 includes one or more specially formed conductive areas 113 disposed underneath and, used in cooperation with a surface mount component ("SMT component") 108. A cover 103 is also coupled to the SMT component 108. The printed wiring assembly 101 includes one or more conventionally constructed microstrip transmission lines 102.

The microstrip transmission line 102 is typically disposed on a first side of a dielectric slab 112. The microstrip transmission line 102 is suspended above a ground plane 100 that is disposed on a second side of the dielectric sheet.

In alternative embodiments the ground plane may be one layer of a multi-layer printed wiring assembly made up of multiple dielectric sheets having conductors disposed on one or more sides. Each of the multiple dielectric sheets are bonded together, typically with a pre-preg bonding material, as is known to those skilled in the art. Alternatively, dielectric sheets may be coupled, or bonded together with solder. Microstrip transmission lines are typically constructed to have a strip width that will yield a desired characteristic impedance when separated from a ground plane by a dielectric sheet of a given thickness.

A conventionally constructed shield assembly 103 is disposed on the printed wiring assembly 101 to shield a first area of circuitry 104 from electromagnetic radiation that is typically impinging on the printed wiring assembly, or is generated by circuitry disposed on a second area 105 of the printed wiring assembly 101. The shield is typically a piece of sheet metal formed to enclose the first area of circuitry 104. The shield typically includes a lid 106 to cover the assembly. The lid is typically electrically and mechanically coupled to a wall assembly 107. The shield is typically electrically coupled to the printed wiring assembly 101 such that it is at a ground potential. In a microstrip circuit assembly the shield is typically coupled electrically and mechanically to the ground plane by methods known to those skilled in the art, such as soldering to a grounded conductor area 109, disposed on the top of the printed wiring assembly. Grounded conductor area 109 is typically coupled to the ground plane via edge plating 110, plated through via holes 111 and the like. It is often desirable to bring a controlled impedance transmission line such as a microstrip transmission line, through a shield assembly with minimal disruption in its impedance.

A surface mount component ("SMT component") 108 allows a controlled impedance transmission line, such as a microstrip transmission line, to pass through a shield assembly. The SMT component tends to allow simplified and cost effective production of printed wiring assemblies having a shield under the SMT component 108 the microstrip transmission line 102 is transformed by changing its width. The strip transmission line includes a line width reduction and shielding that occurs in the conductive area.

The transformation to a strip transmission line is possible because the ground plane 100 is coupled to the surface mount component 108 by means of grounded attachment footprint 113 to form a second ground plane as a part of the SMT component. The shield advantageously couples mechanically and electrically to the second ground plane formed on the SMT component. Those skilled in the art will realize that a strip transmission line is a conductor disposed between two ground planes, while a microstrip line is a conductor disposed above a single ground plane as previously discussed. Thus, by utilizing the SMT component 108 the microstrip conductor 102 passes under the shield 103, while interference to the shielded circuit 104 tends to be minimized. When the microstrip conductor passes under the SMT component its width is changed to that of a stripline conductor.

Figure 2:
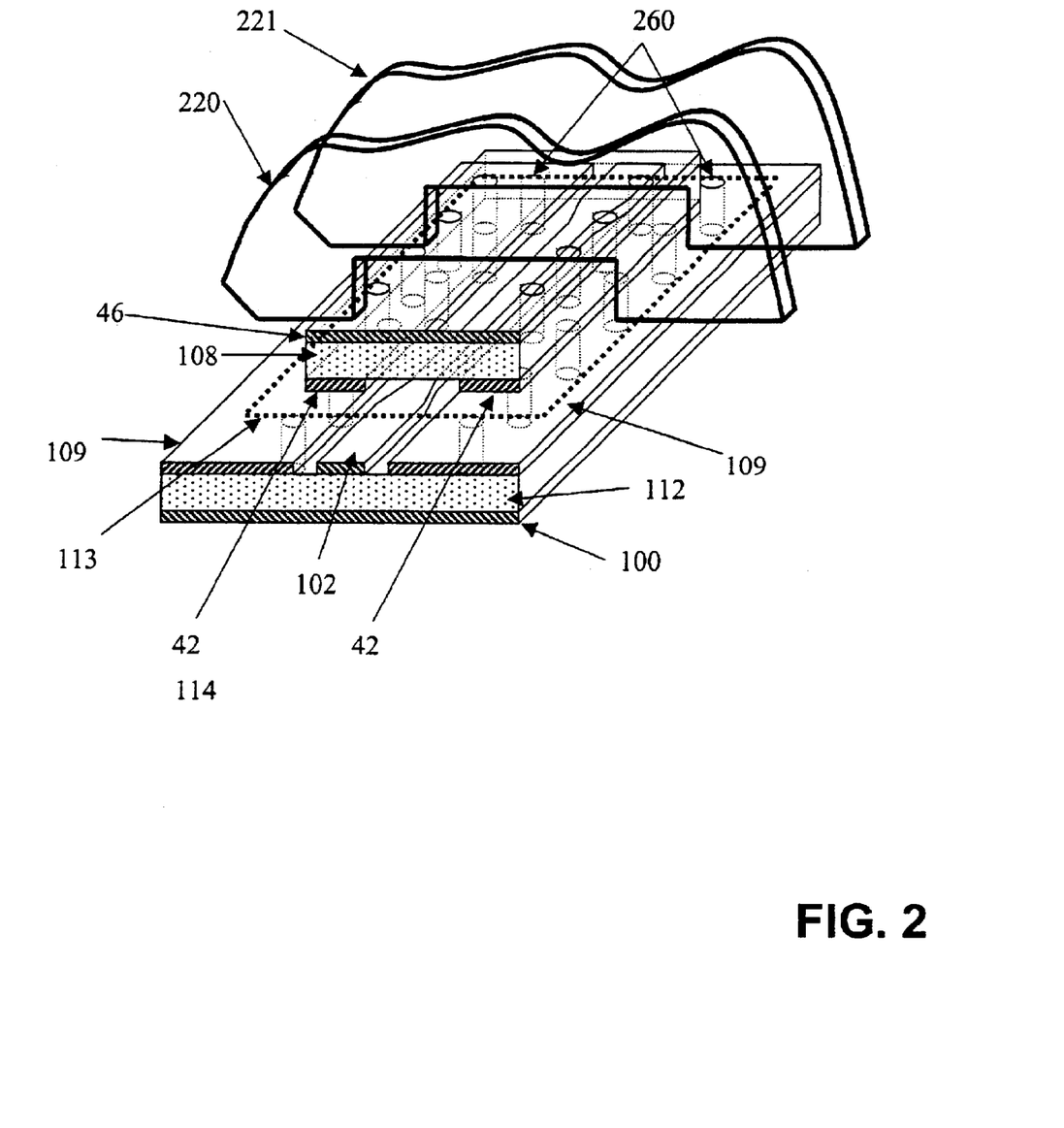
FIG. 2 is a magnified view of the printed wiring assembly including a SMT component and a printed wiring conductor pattern to form a highly isolated RF interconnection.

FIG. 2 is a magnified view of the printed wiring assembly including a SMT component and a printed wiring conductor pattern to form a highly isolated RF interconnection. A base printed circuit board ("PCB"), including a first ground layer 100, a first dielectric layer 112, printed circuit signal trace 102, printed circuit ground layer 109, a SMT component 108, one or more isolation walls, including a first isolation cavity wall 220, and a second isolation cavity wall, and a plurality of conductive through-holes 260 between layers 109 and 100.

A printed wiring assembly ("PWB Assembly") 114 includes a SMT component 108 disposed upon a base PCB 115. Also included in the PWB assembly are a first shield assembly, having a wall shown in partial cross section 220, and a second shield assembly, having a wall shown in partial cross section 221 that are mechanically and electrically coupled to the base PWB 115 and SMT component 108.

PCB 115 includes a ground plane 100 disposed upon a first side of a substrate, or dielectric slab 112 and a ground area 109 disposed upon a second side of the substrate. Also disposed upon the second side of the substrate is a conductor, or PCB signal trace, 102. The second side of the substrate also has a conductive pattern 113 disposed on it. Dielectric slabs typically include materials such as glass teflon, glass epoxy, ceramic and the like. Alternative embodiments include dielectrics that are suitable for the construction of flexible PCBs. Further alternative embodiments include multi layer printed wiring assemblies including one or more layer structure as described above in addition to additional layers of conductors and dielectrics, fabricated as known to those skilled in the art.

The grounds 100, 109 disposed upon the PWB assembly 114 typically include copper, or copper having a solder coating, or equivalent materials that has been disposed upon the dielectric and etched away to form a conductive pattern by methods known to those skilled in the art. The grounds may be formed from copper or any other conductive material that may be conveniently disposed upon the chosen dielectric material 112. As shown ground areas 109 are typically disposed adjacent to conductors 102 to provide shielding and a means of coupling external components that may be present to a desired ground. In alternative embodiments the ground areas 109 need not be disposed adjacent to the microstrip line.

A plurality of feed through holes 260 are used to tie the ground plane 100 to the conductive pattern. As will be appreciated by those skilled in the art, radio frequency ("RF") circuits typically utilize a plurality of feed through holes to minimize a path length from the ground areas 109 to the ground plane 100. Feed through holes 260 may be constructed as plated through holes, "z" wires, grommets and the like. In alternative embodiments the ground plane 100 may be tied to the conductive areas by edge plating. Equivalently a combination of edge plating and feed through holes may be used. A typical use of ground areas 109 on the second side of a printed wiring assembly 114 is to couple a shield assembly 220 to the ground plane 100.

A shield assembly such as first shield assembly 220 or second shield assembly 221 are typically coupled electrically and mechanically to a PCB by a solder connection to a ground layer 109 disposed upon the surface of the PCB. The solder connection may be made by soldering the walls of the shield assembly 220 directly to the surface ground layer 109. Equivalently the shield may have pins that extend into feed through holes, with the shield being soldered into place. In further equivalent embodiments the shield may be coupled to the ground layer by mechanical means such as screws, clips and the like.

The material of the shield may include ferromagnetic and non-ferromagnetic materials such as copper, solder coated copper, iron and the like. As will be appreciated by those skilled in the art the shield may be solid, perforated or constructed of wire mesh, with the allowable mesh opening depending upon the frequency of the interference that has been deemed problematic.

In addition to being coupled to the ground area 109 the shield is also coupled electrically and mechanically to a ground conductor disposed upon a first surface of the SMT component 108.

A SMT Component 108 has a first surface that is made of a conductive material that is coupled to the shield. Coupling is typically achieved with solder, conductive epoxy or the like. In an alternative embodiment a gap is present between the shield and the first surface of the SMT component. In a further alternative embodiment the shield is coupled to the first surface of the SMT component by a dielectric material such as epoxy, or the like that has a relative dielectric constant typically greater than one. The first surface of the SMT component forms a strip line ground plane. Those skilled in the art will realize that the ground plane formed with the first surface of the SMT component operates in cooperation with the microstrip ground plane 100 to form the pair of ground planes utilized in conjunction with a center conductor 102 to form a strip line circuit. A conductive area 113 that is connected to ground plane 100 by means of conductive through holes 260 serves to connect the first surface ground plane of the SMT to the ground plane 100 and to attach the SMT component to the PCB surface.

In a first embodiment of the invention a fully shielded interconnection between shielded cavities 220, 221 is provided. The SMT component 108 when applied to a printed wiring assembly having a conductive pattern 113 appropriate to form part of a stripline structure may be utilized to form a completely shielded interconnection between a first 220 and a second 221 shielded cavity. The completely shielded interconnection is formed from the printed wiring board by virtue of the conductive pattern, functioning in conjunction with the SMT part disposed on the printed wiring board.

Figure 3:
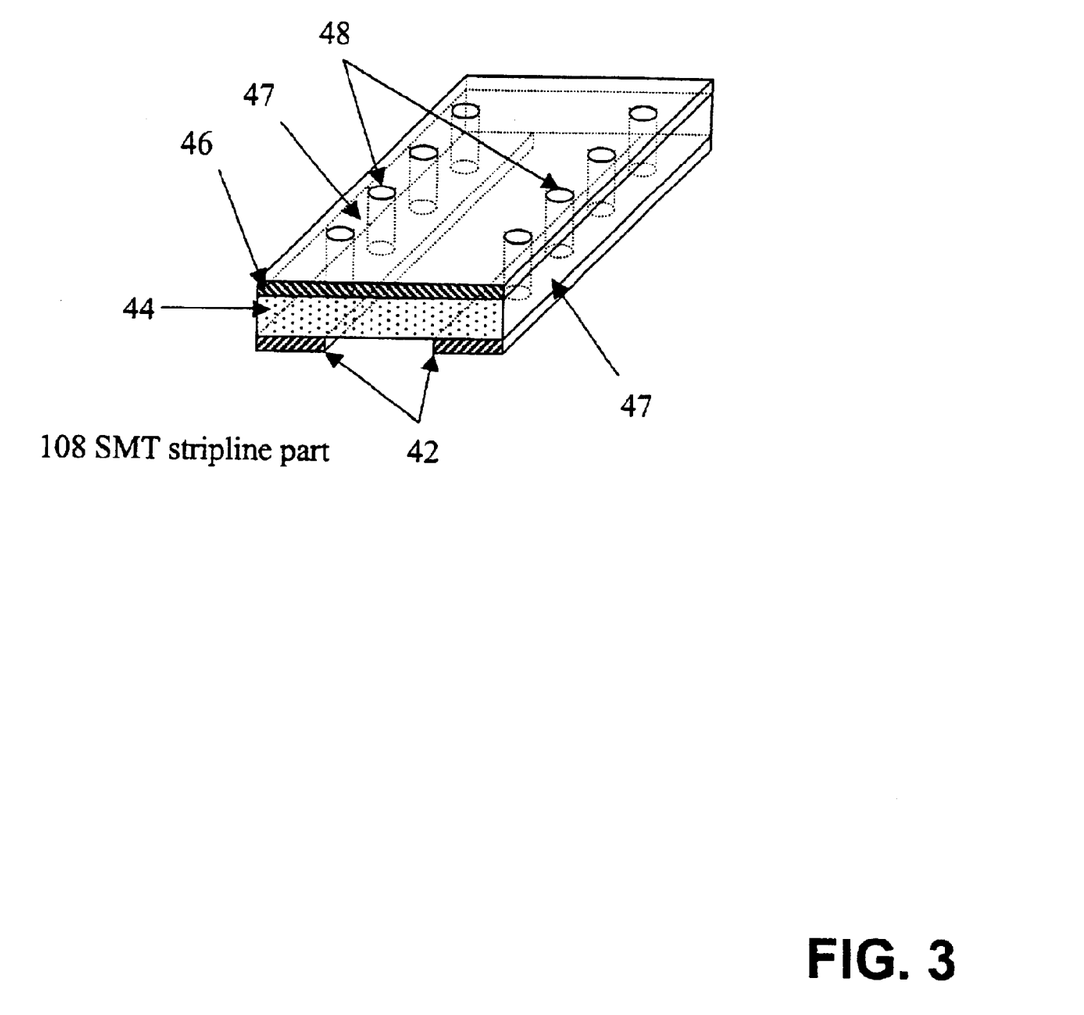
FIG. 3 is a view of the SMT component.

The SMT component 108 is attached to the base PCB 115 so that conductive layers 42 and 113 are substantially aligned and in electrical contact. One or more grounded isolating walls 220, 221 surround and are in electrical contact with the top layer 46 of the SMT component 108, thereby minimizing EMI between the SMT structure and surrounding circuit blocks or structures shielded, and further minimizing EMI between separate circuit cavities, of which walls 220, 221 are contiguous parts.

In a second embodiment of the invention, the construction takes into account that depending on the highest frequency component of the EMI vs. the aperture size, it may not be needed for the shield to actually contact the upper ground layer of the SMT component in order to realize adequate shielding. Thus a gap remains between the upper ground layer and the upper ground layer of the SMT. The gap may be left unfilled, or alternatively filled with a dielectric material. The dielectric material typically has a relative dielectric constant of greater than 1, where 1 is approximately the relative dielectric constant of air. The SMT component 108 is again attached to the base PCB in the manner described in the first embodiment. As would be understood by those skilled in the art, electromagnetic radiation from a gap or slot decreases rapidly when the wavelength of such radiation substantially exceeds the greater of the length or width of a slot or aperture in a shielding structure. Therefore, depending on both the particular requirements for EMI performance, and the highest frequency utilized within or in proximity to the PCB, it may not be necessary for the shields 220 to directly contact or connect to the top layer 46 of the SMT part in order to provide sufficient EMI protection. It will also be appreciated by those skilled in the art that in many types of PCB circuits, erratic operation or noise may be created when an electrical connection is maintained by a mechanical or pressure contact between metal surfaces, without benefit of solder, conductive adhesive, or the like. The second embodiment therefore can have a fabrication cost advantage over the first embodiment when either a pressure or solder contact can be omitted.

When overcrowding of components or signal traces on a printed wiring assembly occurs it often leads to a localized EMI condition ("crosstalk") on a single-layer (i.e. ceramic) substrate, the SMT part in conjunction with the conductive pattern by itself, without any additional shielding, can provide a benefit. In other words, the first, second and third embodiments each provide a different level of EMI attenuation, attendant with a varying degree of mechanical complexity and/or assembly cost. For example, the fully shielded (#3) version might not be compatible with an SMT-only assembly flow.

In a third embodiment of the invention the SMT component 108 is again attached to the base PCB in the manner described for the first embodiment. As will be appreciated by those skilled in the art, it is possible that, for a particular PCB, the incorporation of one or more shielded enclosures or cavities provides more EMI suppression than is actually required. In situations wherein undesired electromagnetic coupling exists primarily between adjacent PCB traces, or primarily between a PCB trace and an adjacent component, the SMT component itself, without the inclusion of additional shield walls, comprises a shield over and around the EMI susceptible trace, thereby providing a reduction in EMI. The third embodiment therefore can have a fabrication cost advantage over the first and second embodiments when shielded enclosures or cavities can be omitted.

FIG. 3 is a view of the SMT component. The SMT component 108 comprises a lower conductive layer 42, a second dielectric layer 44, an upper conductive layer 46, a plurality of conductive through-holes 48 between layers 42 and 46, and in an alternative embodiment, edge plating 47 between layers 42 and 46.

In a first embodiment of the SMT component, layers 42 and 46 are coupled with conductive through-holes 48, comprising plated through holes, silver epoxy filled holes, or the equivalent. In a second embodiment of the SMT component, layers 42 and 46 are coupled with conductive, side edge plating (or "wrap metalization") 47, typically including deposited copper or the like. In a third embodiment of the SMT component, layers 42 and 46 are coupled with both conductive through-holes 48, comprising plated through holes, silver epoxy filled holes, or the equivalent, and conductive, side edge plating (or "wrap metalization") 47, typically including deposited copper or the like. In this embodiment the wrap metalization provides full shielding past the via, or plated through, holes. In a fourth embodiment of the SMT component, layers 42 and 46 are coupled through one or more external shield walls 220, by the coupling common to the walls, the conductive pattern 113, ground area 109, and layers 42 and 46.

Figure 4:
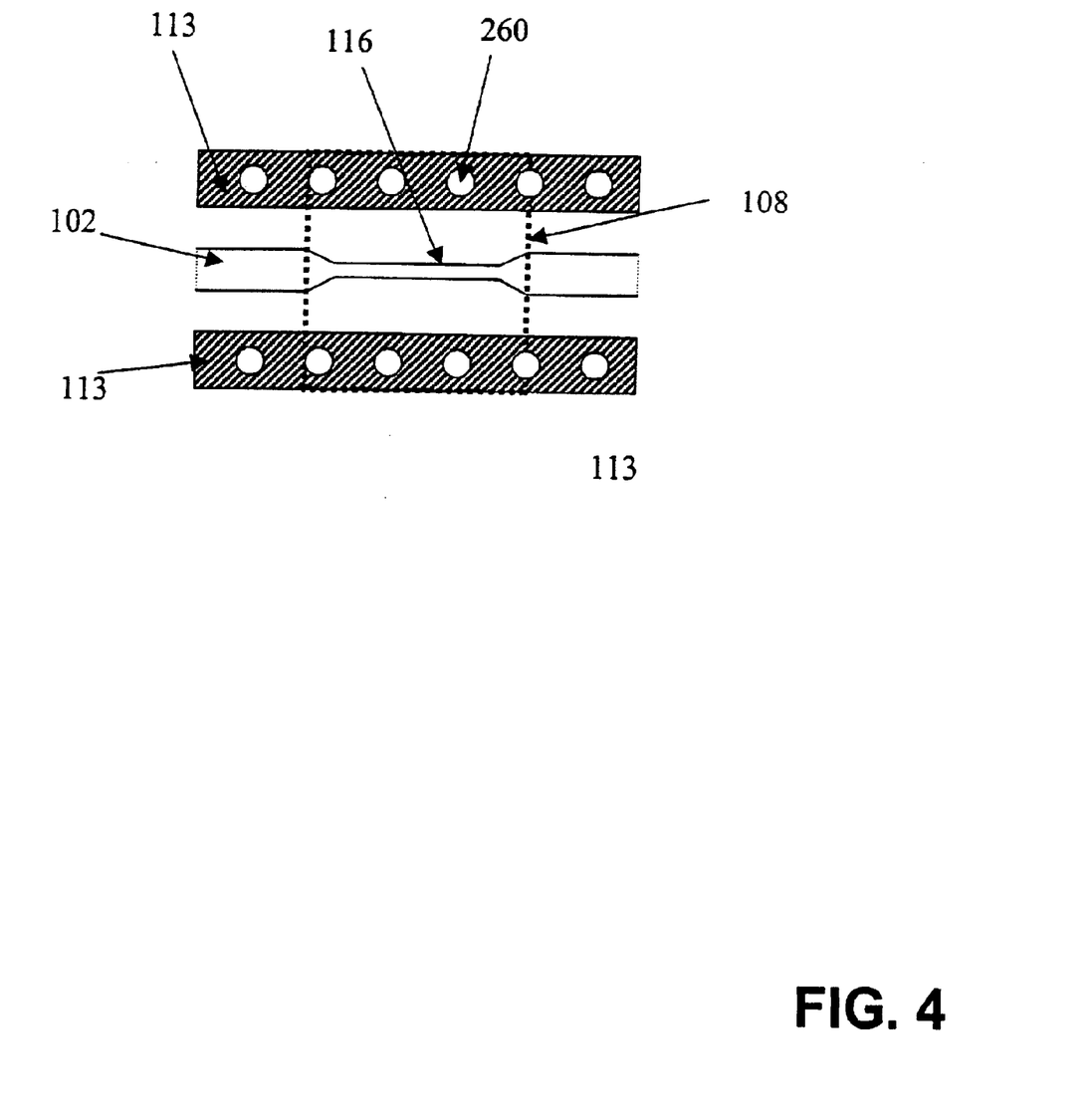
FIG. 4 is a view of a conductive area disposed upon the printed wiring assembly to which the SMT component is coupled.

FIG. 4 is a view of the conductive area, or pattern, 113 disposed upon the base PCB (115 of FIG. 2) to which the SMT component is coupled. The circuit trace (102 of FIG. 2) that passes underneath the SMT part is comprised of a microstrip transmission line 102 which transitions into stripline 116 transmission line, under the SMT stripline part 108, and then back to a microstrip transmission line. The microstrip transmission line utilizes a single ground plane (100 of FIG. 2), while a stripline utilizes two ground planes (100 and 46 of FIG. 2). The conductive pattern of the signal trace is changed in width to maintain a constant characteristic impedance. Although 50-ohm microstrip and stripline is discussed, it is noted that characteristic line impedances greater or lesser than 50 ohms may be used if desired. Those knowledgeable in the art will recognize that for a fixed thickness and dielectric constant of dielectric layers 44 and 112, microstrip trace 102 will be wider than stripline trace 116 when both the microstrip and stripline are correctly proportioned to exhibit the same characteristic impedance In a first embodiment of the conductive area 113, the locations of the multiple conductive plated through holes 260 may be made relatively congruent with the through holes 48 disposed within the SMT component, for the purpose of minimizing the inductance between the pair of ground planes comprising the stripline region. top and bottom. However this configuration may be difficult to produce and inspect, and the holes 260 may wick the solder away from the SMT component mounting interface 113.

In a second embodiment of the conductive area 113, the locations of the multiple conductive plated through holes 260 fall outside of the outline of the SMT part, but are close enough to it to still provide sufficient grounding and a good solder joint. Solder wicking as described above can be prevented by selectively applying an optional pattern or layer of solder resisting film (not shown) over holes 260, using methods known to those skilled in the art.

Figure 5:
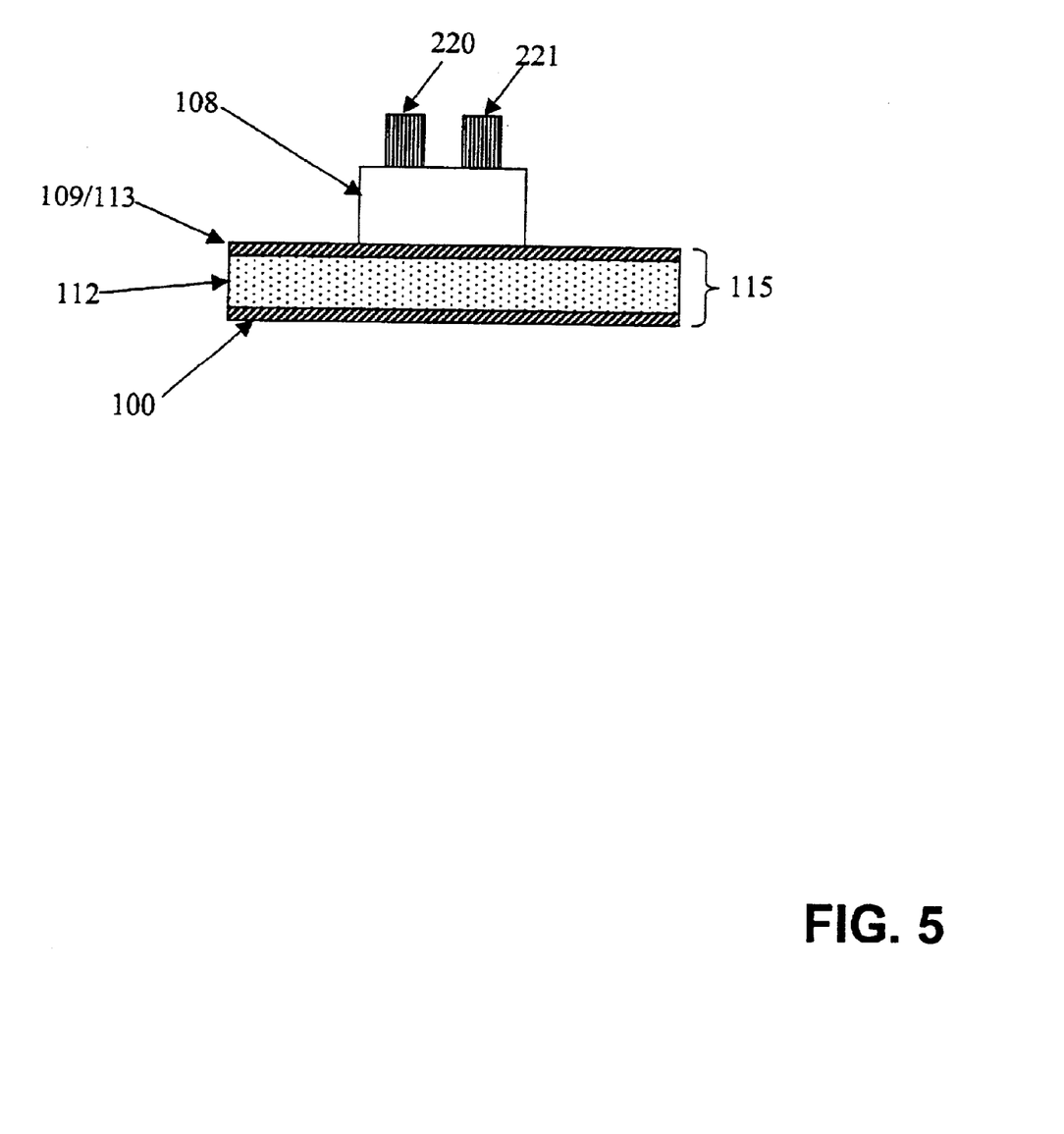
FIG. 5 is a side cross-section view of the attachment of the SMT component to the printed wiring assembly and to the shield assembly.

FIG. 5 is a side cross-section view of the attachment of the SMT component to the printed wiring assembly and to the shield assembly. As shown shields 220,221 are coupled to The SMT component, which is in turn coupled to the base PCB 115 that includes the conductive pattern.

This invention has been described in detail in connection with the preferred embodiments. These embodiments are examples only and the invention is not restricted thereto. It will be easily understood by those skilled in the art that variations and modifications can be made to the invention within the scope of the appended claims.

What is claimed is:

1. A shielded interconnection for coupling shielded cavities comprising:
   a first cavity including a first shield;
   a second cavity including a second shield;
   a printed wiring board including a ground plane disposed upon a first layer and a conductive pattern disposed upon a second layer; and
   a SMT part disposed upon the printed wiring board coupling the first shield to the second shield, and to the ground plane through a SMT ground disposed on a first aide of the SMT facing, and coupled to, the conductive pattern, and through a SMT ground disposed on a second side of the SMT facing away from the conductive pattern that is coupled to the first side of the SMT;
   whereby a shielded cavity interconnection is provided.

2. The shielded interconnection for coupling shielded cavities of claim 1, in which the printed wiring board is a microstrip board.

3. The shielded interconnection for coupling shielded cavities of claim 1, in which the SMT part is coupled to the first shield, the second shield, and the ground plane by a soldered connection.

4. The shielded interconnection for coupling shielded cavities of claim 1, in which the SMT part is coupled to the first shield, the second shield, and the ground plane by a conductive epoxy.

5. The shielded interconnection for coupling shielded cavities of claim 1, in which the SMT part is coupled to the ground plane by a soldered connection, and a gap is present between the SMT part the first shield, and the second shield.

6. The shielded interconnection for coupling shielded cavities of claim 1, in which the SMT part is coupled to the ground plane by a soldered connection, and a gap is present between the SMT part the first shield, and the second shield, the gap being filled with a dielectric material other than air.

7. The shielded interconnection for coupling shielded cavities of claim 1, in which the first shield is a chem-etched shield.

8. The shielded interconnection for coupling shielded cavities of claim 1, in which the first shield is perforated.

9. The shielded interconnection for coupling shielded cavities of claim 1, in which the conductive pattern includes a microstrip transmission line portion, providing a desired impedance as determined by the printed wiring board, coupled to a stripline portion providing the desired impedance as determined by the printed wiring board and the SMT part.

10. The shielded interconnection for coupling shielded cavities of claim 8, in which the stripline portion is coupled to the transmission line portion by a transition region.

11. The shielded interconnection for coupling shielded cavities of claim 1, in which the first side of the SMT is coupled to the second side at the SMT by a plurality of plated through holes.

12. The shielded interconnection for coupling shielded cavities of claim 1, in which the first side of the SMT is coupled to the second side of the SMT by edge plating.

13. A shielded interconnection comprising:
   a base printed circuit board;
   a signal trace disposed upon the base printed circuit board having a covered portion of the signal trace and an uncovered portion of the signal trace;
   a conductive pattern disposed upon the base printed circuit board; and
   a SMT part coupled to the conductive pattern, and covering the covered portion of the signal trace, wherein the covered portion of the signal trace is a stripline conductor.

14. The shielded interconnection of claim 13, wherein the base printed circuit board further comprises:
   a dielectric having a first side and a second side;
   a ground plane disposed on the first side; and
   the signal trace disposed upon the second side.

15. The shielded interconnection of claim 13, wherein the uncovered portion of the signal trace is a microstrip conductor.

16. The shielded interconnection of claim 13, wherein the covered portion of the signal trace is part of the conductive pattern.

17. The shielded interconnection of claim 13, wherein the conductive pattern comprises a conductive area coupled to a ground plane via conductive feed throughs.

18. The shielded interconnection of claim 17 above, wherein the conductive pattern further comprises a solder mask disposed over the conductive feed throughs.

19. A method of providing a highly isolated radio frequency interconnection comprising the steps of:
   covering a microstrip circuit, including a trace, with a SMT part to form a stripline circuit region; and
   transforming a microstrip trace width to a stripline trace width in the stripline circuit region.

20. The method of providing a highly isolated radio frequency interconnection of claim 19, further comprising the step of coupling a stripline ground to a microstrip ground.

21. The method of providing a highly isolated radio frequency interconnection of claim 19, in which the step of coupling the stripline ground to the microstrip ground is achieved by coupling to an intermediate ground disposed between the microstrip circuit and the SMT part.

22. The method of providing a highly isolated radio frequency interconnection of claim 19, in which coupling the stripline ground to an intermediate ground is achieved by coupling to plated through holes.

23. The method of providing a highly isolated radio frequency interconnection of claim 19, in which coupling the microstrip ground to an intermediate ground is achieved by coupling to plated through holes.

24. A shielded interconnection comprising:
   a base printed wiring board including:
      a base printed wiring board dielectric layer having a first side of the base printed wiring board dielectric layer and a second side of the base printed wiring board dielectric layer;
      a first conductive layer of the base printed wiring board, including a ground plane, disposed upon the first side of the dielectric layer of the base printed wiring board;
      a second conductive layer of the base printed wiring board, including a microstrip trace transitioning to a stripline trace and a ground area, disposed upon the second side of the dielectric layer of the base printed wiring board in which the ground areas of the second conductive area is coupled to the ground plane; and
   a SMT part including:
      a SMT dielectric layer having a first side of the SMT dielectric layer, and a second side of the SMT dielectric layer;
      a first conductive layer of the SMT part, including a ground plane, disposed upon the first side of the SMT dielectric layer of the SMT part;
      a second conductive layer of the SMT part, including a ground plane, disposed upon the second side of the SMT dielectric layer of the SMT part in which the first conductive layer ground plane is coupled to the second conductive layer ground plane by a plurality of plated feed through holes;
   whereby the SMT part is disposed upon the base printed wiring board such that the SMT pert covers the stripline trace is coupled to the base printed wiring board through the second conductive layer ground of the base printed wiring board and the ground of the second conductive layer of the SMT part.

25. A shielded interconnection comprising:
   a base printed wiring board including:
   a base printed wiring board dielectric layer having a first side of the base printed wiring board dielectric layer and a second side of the base printed wiring board dielectric layer
   a first conductive layer of the base printed wiring board, including a ground plane, disposed upon the first side of the dielectric layer of the base printed wiring board;
   a second conductive layer of the base printed wiring board, including a microstrip trace transitioning, by tapering the line, to a stripline trace and a ground area, disposed upon the second side of the dielectric layer of the base printed wiring board in which the ground area of the second conductive area is coupled to the ground plane; and
   a SMT part including:
   a SMT dielectric layer having a first side of the SMT dielectric layer, and a second side of the SMT dielectric layer;
   a first conductive layer of the SMT part, including a ground plane, disposed upon the first side of the SMT dielectric layer of the SMT part;
   a second conductive layer of the SMT part, including a ground plane, disposed upon the second side of the SMT dielectric layer of the SMT part in which the first conductive layer ground plane is coupled to the second conductive layer ground plane by a plurality of plated feed through holes;
   whereby the SMT part is disposed upon the base printed wiring board such that the SMT part covers the stripline trace is coupled to the base printed wiring board through the second conductive layer ground of the base printed wiring board and the ground of the second conductive layer of the SMT part by a solder connection.

26. A shielded interconnection comprising:
   a base printed wiring board including:
      a base printed wiring board dielectric layer having a first side of the base printed wiring board dielectric layer and a second side of the base printed wiring board dielectric layer;
      a first conductive layer of the base printed wiring board, including a ground plane, disposed upon the first side of the dielectric layer of the base printed wiring board;
      a second conductive layer of the base printed wiring board, including a microstrip trace transitioning to a stripline trace and a ground area, disposed upon the second side of the dielectric layer of the base printed wiring board in which the ground area of the second conductive area is coupled to the ground plane; and
      a SMT part including:
      a SMT dielectric layer having a first side of the SMT dielectric layer, and a second side of the SMT dielectric layer;

a first conductive layer of the SMT part, including a ground plane, disposed upon the first side of the SMT dielectric layer of the SMT part;

a second conductive layer of the SMT part, including a ground plane, disposed upon the second side of the SMT dielectric layer of the SMT part in which the first conductive layer ground plane is coupled to the second conductive layer groundplane by an edge plating;

whereby the SMT part is disposed upon the base printed wiring board such that the SMT part covers the stripline trace is coupled to the base printed wiring board through the second conductive layer ground of the base printed wiring board and the ground of the second conductive layer of the SMT part.

27. A shielded interconnection comprising:

a base printed wiring board including:

a base printed wiring board dielectric layer having a first side of the base printed wiring board dielectric layer and a second side of the base printed wiring board dielectric layer a first conductive layer of the base printed wiring board, including a ground plane, disposed upon the first aide of the dielectric layer of the base printed wiring board;

a second conductive layer of the base printed wiring board, including a microstrip trace transitioning, by tapering the me to a stripline trace and a ground area, disposed upon the second side of the dielectric layer of the base printed wiring board in which the ground area of the second conductive area is coupled to the ground plane; and a SMT part including:

a SMT dielectric layer having a first side of the SMT dielectric layer, and a second side of the SMT dielectric layer;

a first conductive layer of the SMT part, including a ground plane, disposed upon the first side of the SMT dielectric layer of the SMT part;

a second conductive layer of the SMT part, including a ground plane, disposed upon the second side of the SMT dielectric layer of the SMT part in which the first conductive layer ground plane is coupled to the second conductive layer ground plane by an edge plating;

whereby the SMT part is disposed upon the base printed wiring board such that the SMT part covers the stripline trace is coupled to the base printed wiring board through the second conductive layer ground of the base printed wiring board and the ground of the second conductive layer of the SMT part by a solder connection.

* * * * *

UNITED STATES PATENT AND TRADEMARK OFFICE
CERTIFICATE OF CORRECTION

PATENT NO. : 6,949,992 B2
DATED : September 27, 2005
INVENTOR(S) : Richard Sweeney and Jason Snodgress It is certified that error appears in the above-identified patent and that said Letters Patent is hereby corrected as shown below:

Column 8,
Line 12, "aide" should be -- side --.

Column 9,
Line 55, "areas" should be -- area --.

Column 10,
Line 5, "pert" should be -- part --.

Column 11,
Line 8, "groundplane" should be -- ground plane --.
Line 24, "aide" should be -- side --.

Column 12,
Line 1, "me" should be -- line --.

Signed and Sealed this

Seventh Day of February, 2006

JON W. DUDAS
*Director of the United States Patent and Trademark Office*